United States Patent [19]
Tripathi et al.

[11] Patent Number: 5,777,512
[45] Date of Patent: Jul. 7, 1998

[54] METHOD AND APPARATUS FOR OVERSAMPLED, NOISE-SHAPING, MIXED-SIGNAL PROCESSING

[75] Inventors: Adya S. Tripathi; Cary L. Delano, both of San Jose, Calif.

[73] Assignee: Tripath Technology, Inc., Santa Clara, Calif.

[21] Appl. No.: 667,925

[22] Filed: Jun. 20, 1996

[51] Int. Cl.$^6$ .................................................. H03F 3/217
[52] U.S. Cl. ............................... 330/207 A; 330/110
[58] Field of Search .......................... 330/10, 207 A, 330/251, 110

[56] References Cited

U.S. PATENT DOCUMENTS 4,843,339  6/1989  Burt et al. ............................. 330/10
5,352,986  10/1994  Modgil et al. ......................... 330/10

FOREIGN PATENT DOCUMENTS 616422  9/1994  European Pat. Off. ............. 330/251

*Primary Examiner*—James B. Mullins
*Attorney, Agent, or Firm*—Townsend and Townsend and Crew LLP; Kenneth R. Allen

[57] ABSTRACT

A signal processing circuit is provided which includes a frequency selective network in a feedback loop for noise shaping purposes. A sampling analog-to-digital converter in the feedback loop operates at a sample frequency substantially above the Nyquist frequency. A switching device is driven by the sampling analog-to-digital converter and produces a continuous-time output signal which is continuously monitored by and fed back to the frequency selective network for noise and distortion correction in the feedback loop. This is in contrast to traditional techniques which employ only state feedback. State feedback (i.e., digital or sampled) of the output of the analog-to-digital converter may also be employed in combination with the continuous-time feedback of the switching device output.

50 Claims, 12 Drawing Sheets

METHOD AND APPARATUS FOR OVERSAMPLED, NOISE-SHAPING, MIXED-SIGNAL PROCESSING

BACKGROUND OF THE INVENTION

The present invention relates to the field of oversampled, noise-shaping signal processing which includes, for example, sigma-delta modulation technology. Specifically, the present invention provides a method and apparatus for oversampled, noise-shaping, mixed-signal processing for intelligent power applications and a variety of other signal processing applications. Mixed-signal processing here refers to the processing of both continuous-time (e.g., analog) and discrete-time (e.g., digital or sampled analog) signals. The present invention replaces pulse width modulation (PWM) technology in any application in which PWM may be employed. For example, in specific embodiments described herein, the present invention provides a switching power amplifier which employs a modified oversampled, noise-shaping processor instead of PWM for increased efficiency, and low noise and distortion performance.

The market for personal computers (PCs) with multimedia capabilities is rapidly expanding. Consumers are demanding faster processors and improved graphics to run increasingly sophisticated software applications and CD-ROM titles. For many applications, however, processing speed and high quality video are simply not enough. For video games, for example, high volume, stereo quality sound has become a marketing necessity. In addition, to faithfully reproduce three-dimensional "surround sound" effects, high fidelity sound reproduction is essential.

Current PC sound cards typically employ 16-bit architectures which generate from 1–2 watts of output power. Given that consumers are demanding much higher audio power, multimedia PCs are generally available with satellite speakers which include linear power amplifiers (e.g., class AB) powered by separate power supplies. The actual efficiency of a typical class AB audio amplifier is approximately 60% at peak power, but is considerably less for average or rms output levels. For example, at 10 $W_{rms}$, a class AB amplifier's efficiency is more likely in the range of 20–30%. Assuming an efficiency of 25% and a desired audio output of 10 $W_{rms}$/channel, 80 W of power required just for driving the speakers. Given that a typical PC has only 200–250 W available, the necessity of a separate power supply is manifest.

The inherent inefficiency of linear power amplifiers has led to variety of other approaches to the problem of audio amplification. For example, class D amplifiers using PWM have been employed for some applications because of their clear advantage in power efficiency over linear power amplifiers. However, current PWM technology achieves ratios of signal power to THD+noise on the order of only 40–60 dB due to a number of sources of distortion including inter-modulation distortion; spectral foldback from the sidebands of the sample frequency into the base band; asymmetrical rise and fall times; asymmetrical low-to-high and high-to-low propagation delays; "break before make"(i.e., "dead zone") distortion; supply bounce; and the fact that distortion characteristics vary considerably over the audio band due to low oversampling ratios. Attempts to solve these problem by, for example, increasing the sample frequency (thereby moving the sample sidebands away from the base band) are limited as pulse rise and fall times become significant portions of the sample clock period and other types of distortion dominate. As a result, current PWM technology cannot produce sufficient sound quality for moderate to high end audio applications in which noise rejection of at least 90 dB is required.

In response to this need, several attempts have been made to design switching audio amplifiers using oversampled, noise-shaping modulators, specifically sigma-delta modulators, for their noise shaping characteristics, see H. Ballan and M. Declercq, 12 V-$\Sigma\Delta$ Class-D Amplifier in 5V CMOS Technology, pp. 559–562 (IEEE 1995 Custom Integrated Circuits Conference). However, as will be discussed, including power MOS transistors in a sigma-delta modulator loop presents additional problems which hinder overall amplifier performance. A standard first order sigma-delta modulator is shown in FIG. 1. An integrator 102 is connected in series with a comparator 104 which is essentially a two-level quantizer with a sampling rate $f_s$. The output of comparator 104 is fed back to integrator 102 via digital-to-analog converter (D/A) 106 and adder 108. The feedback forces the average value of the quantized output signal to track the average value of the input to modulator 100. Any difference between the quantized output and modulator input is accumulated in integrator 102 and eventually corrected. For first-order sigma-delta modulators, noise in the signal band due to quantization error is reduced by approximately 9 dB for each doubling of the oversampling ratio (OSR). The OSR is given by $f_s/2f_o$, where $2f_o$ is the Nyquist rate, i.e., twice the bandwidth $f_o$ of the baseband signal. For second-order sigma-delta modulators, this noise is reduced by approximately 15 dB (9 dB+6 dB) for the same increase in OSR. However, as discussed above, noise improvements achieved by increases in the OSR, i.e., increases in $f_s$, are ultimately limited as the rise and fall times of the output signal become significant with respect to the sample period. For a thorough discussion of sigma-delta modulation techniques, see Candy and Temes, Oversampling Delta-Sigma Data Converters, pp. 1–25 (IEEE Press, 1992).

As mentioned above, the insertion of power MOS transistors in a standard sigma-delta modulator is accompanied by other performance problems. For audio applications, power MOS transistors drive relatively low impedances and must therefore have output impedances smaller than 1 ohm for good overall efficiency. As a result, the switching characteristics of such transistors are relatively slow, varying from an ideal switching characteristic as shown in FIG. 2, and thereby generating distortion which is typically at or above the −60 dB level. The power MOS transistor switching characteristic of FIG. 2 is typical of a p-channel MOSFET and an n-channel MOSFET arranged in the well known totem-pole configuration. Because standard sigma-delta modulators employ digital or state feedback (i.e., D/A 106 of FIG. 1), the asymmetric edges of the power transistor output are not seen by the integrator stages. Consequently, standard sigma-delta modulators are not able to correct for the distortion introduced by the power MOS transistors because of the exclusive use of state feedback.

Moreover, because modern sigma-delta modulators use sampled integrators, simply feeding the unconverted power transistor output back to the integrator stages has not been effective. This is due to the fact that sampled integrators tend to have aliasing problems with high frequency distortion.

In addition, the delay introduced by a power MOS transistor stage causes the feedback to be increasingly uncorrelated with the input, further undermining the feedback's corrective function. Moreover, the additional delay due to a power MOS transistor stage can adversely affect circuit stability. In short, any noise reduction improvements achieved by the use of standard sigma-delta modulation are rendered insignificant by the distortion introduced by the power MOS transistors and associated driver stages.

In view of the foregoing discussion, it is apparent there is a need for a highly efficient, low distortion power amplifier for audio and multimedia applications.

SUMMARY OF THE INVENTION

The present invention provides an oversampled, noise-shaping mixed-signal processor for intelligent power applications and a wide variety of other signal processing applications. As mentioned above, the processor of the present invention may be employed to replace PWM technology in any application where PWM is used. This includes, for example, motor control applications, power factor correction, switching regulators, resonant mode switching, uninterrupted power supplies, etc; potentially thousands of applications. Therefore, although specific embodiments are described herein, it will be understood that the present invention may be optimized for use in many different applications.

According to a specific embodiment, a switching power amplifier is provided which is highly efficient and which produces a relatively powerful output signal having very low distortion. To achieve this result, the present invention first employs continuous-time feedback (in contrast to pure state feedback) from the output of its power switching stage. This ensures that all of the information contained on the output is available for comparison to the input, thus allowing the modified oversampled, noise-shaping modulator described herein to account for and correct distortion introduced by the power MOS transistors of the switching stage.

Secondly, the present invention provides the continuous-time feedback in such a way as to reduce the aliasing effects of the high frequency distortion on the feedback path introduced by the power MOS transistors which might otherwise interfere with the baseband to an unacceptable degree. According to a first embodiment, a low pass anti-aliasing filter is employed in the feedback path. According to a second embodiment, continuous-time integrators are used for the integrator stages which receive feedback from the power switching stage output. According to a third embodiment, one or more of the integrators receiving the continuous-time feedback are oversampled with respect to the comparator sample frequency. Each of the solutions encompassed by the present invention combine the use of continuous-time feedback to compensate for low frequency distortion, and some means of attenuating or reducing the aliasing effects of high frequency distortion introduced via the feedback path. It will be understood that the present invention is not limited to baseband applications, and that various modifications to the embodiments described herein allow the invention to be employed in any frequency band, including high frequency power amplification and a variety of other high frequency applications. These modifications may include, for example, the use of band pass filtering in the feedback path, integrators hooked up in band pass configurations, and feed forward from the output of one integrator stage to the input of another.

As will be discussed, various embodiments of the present invention employ different order oversampled, noise-shaping processors with a variety of combinations of continuous-time and state (e.g., digital or quantized) feedback to the different integrator stages. Because the distortion at the input to the first integrator stage is the dominant source of the final distortion, even pure state feedback may be employed for later stages. Moreover, as will be seen, a small fraction of state feedback may even be introduced into the first integrator stage for loop stabilization purposes.

Thus, according to the present invention, a signal processing circuit is provided which includes a frequency selective network in a feedback loop for noise-shaping purposes. A sampling analog-to-digital converter in the feedback loop operates at a sample frequency substantially above the Nyquist frequency. A switching device is driven by the sampling analog-to-digital converter and produces a continuous-time output signal which is fed back to the frequency selective network for noise and distortion correction in the feedback loop. In more specific embodiments, the aliasing effects are reduced by various means.

A further understanding of the nature and advantages of the present invention may be realized by reference to the remaining portions of the specification and the drawings.

DESCRIPTION OF SPECIFIC EMBODIMENTS

Figure 1:
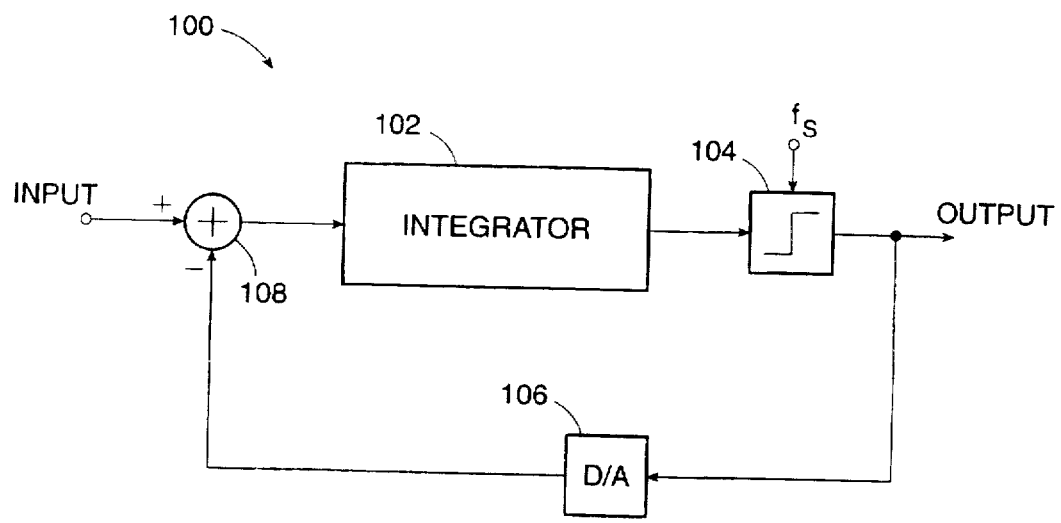
FIG. 1 is a simplified block diagram of a standard first order oversampled, noise-shaping modulator.
Figure 2:
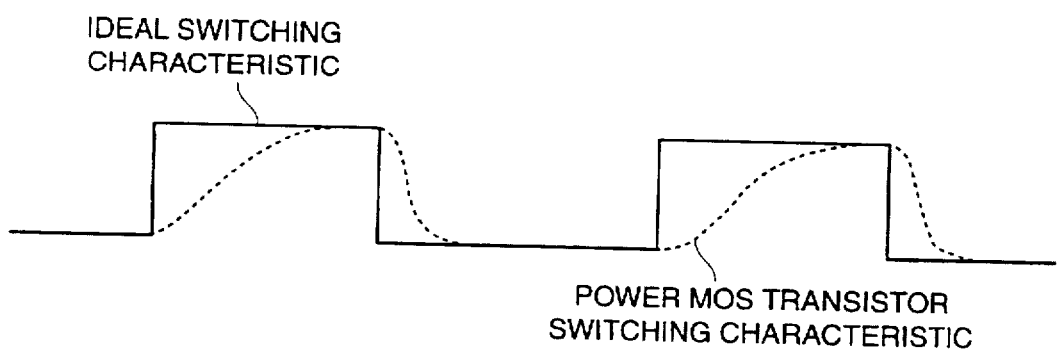
FIG. 2 is a graph comparing a typical power MOS transistor switching characteristic with an ideal switching characteristic.
Figure 3A:
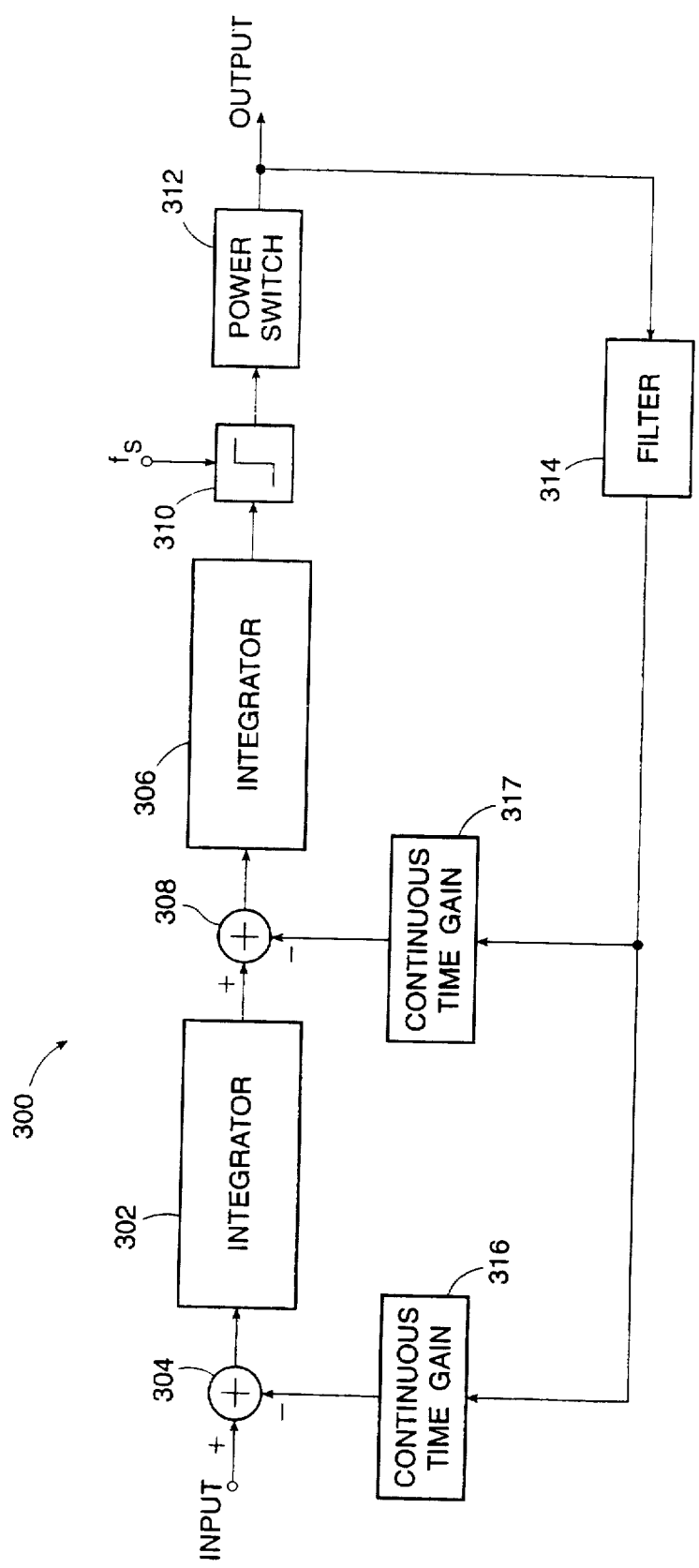
FIGS. 3A–D are simplified block diagrams various specific embodiments of a second-order modified oversampled, noise-shaping digital amplifier designed according to the invention.
Figure 3B:
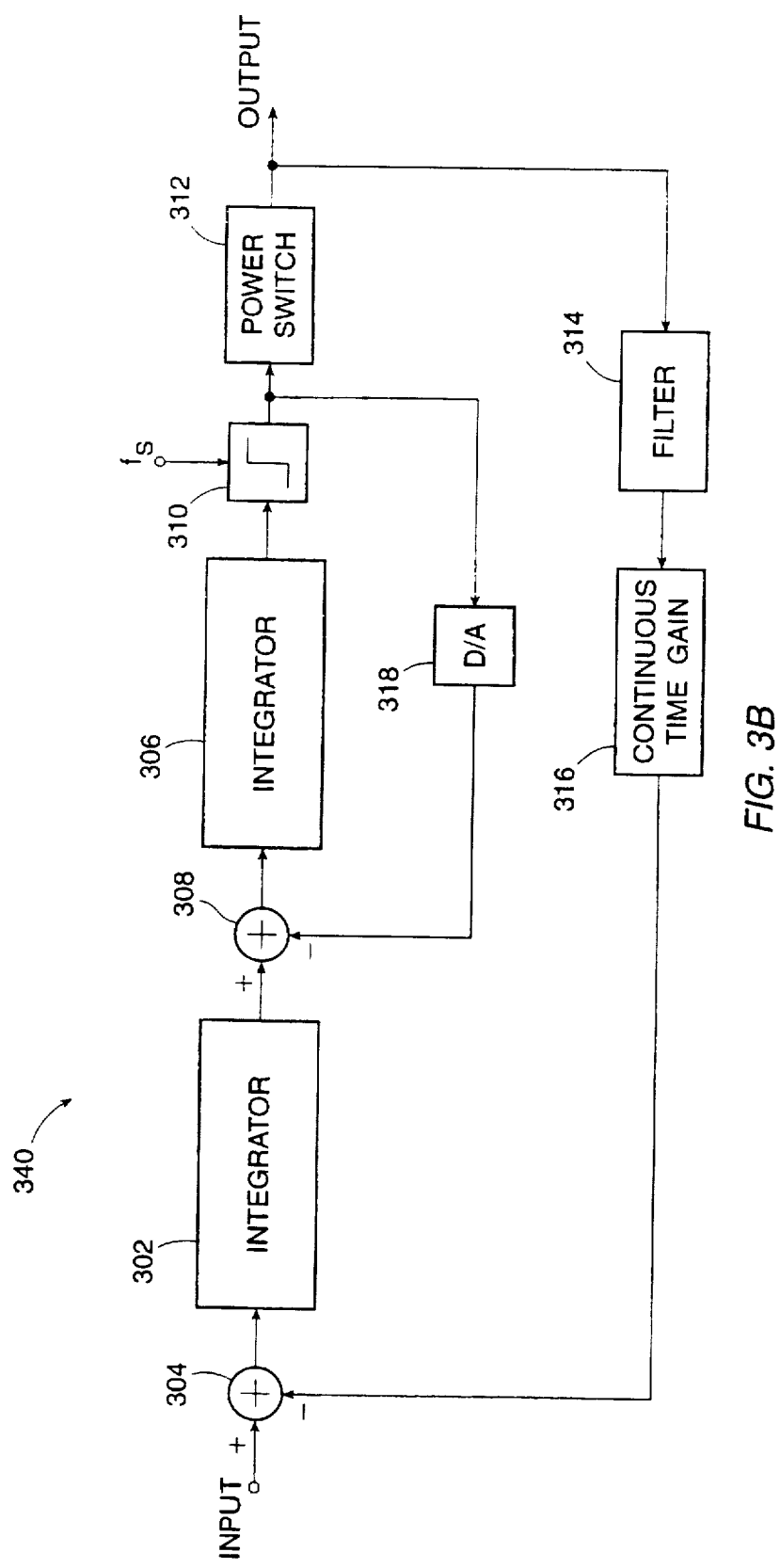
Figure 3C:
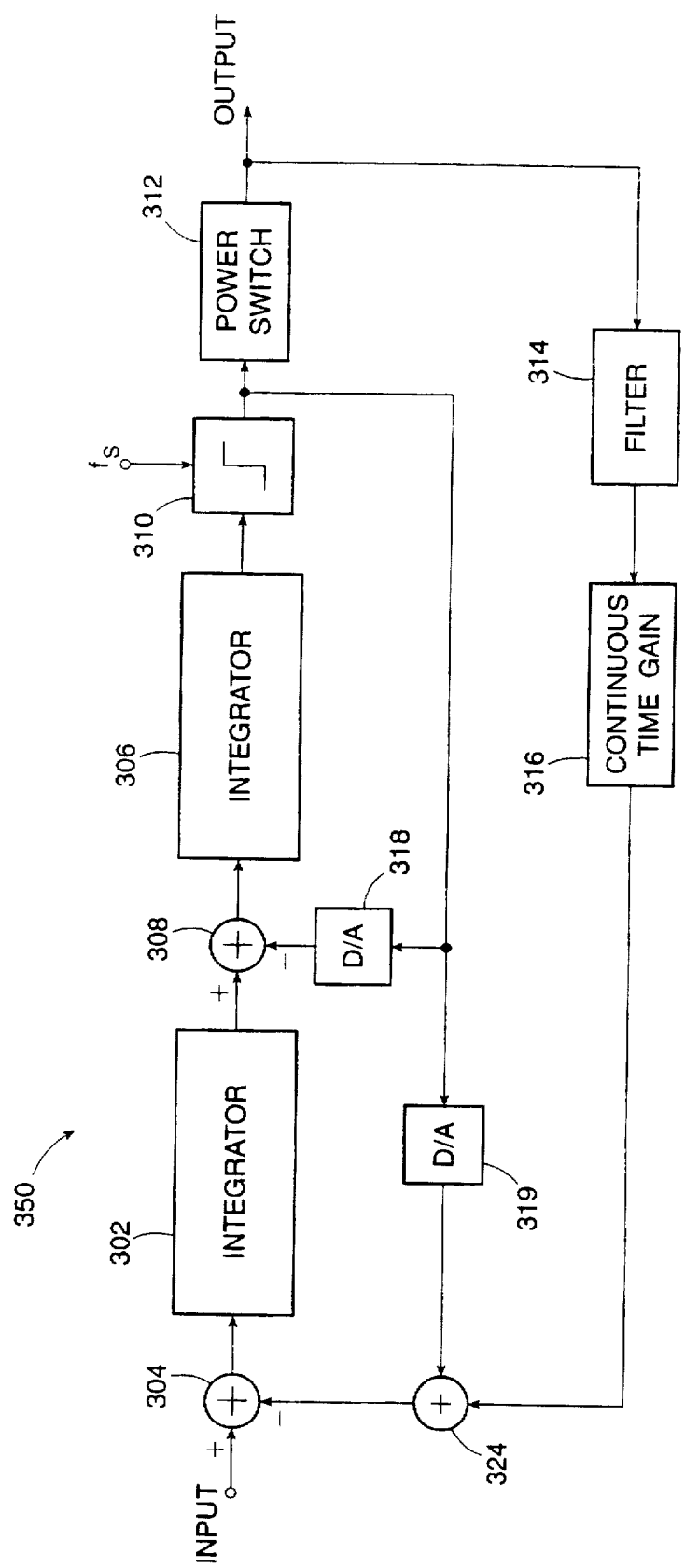
Figure 3D:
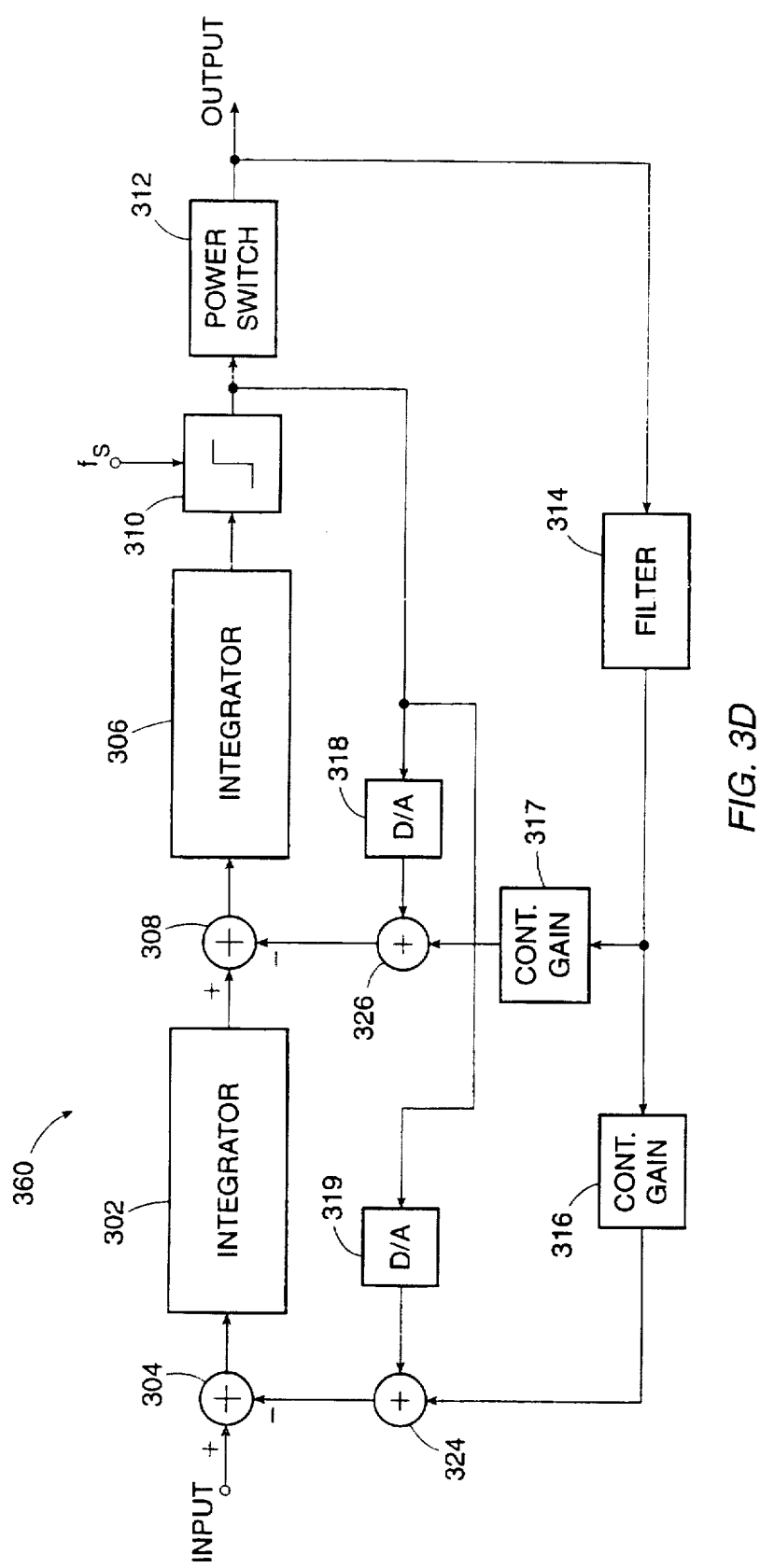

FIGS. 3A–D are simplified block diagrams of four embodiments 300, 340, 350 and 360 of a second-order modified oversampled, noise-shaping digital amplifier designed according to the invention. With reference to the common features of the embodiments, an input signal is introduced to a first integrator stage 302 via adder 304. The output of first integrator stage 302 is transmitted to a second integrator stage 306 via adder 308. A clocked comparator stage 310 sampled at sample frequency $f_s$ receives the output of second integrator stage 306 and transmits the resulting logic signal to power switching stage 312. According to the various embodiments, the output of power switching stage is selectively fed back to first integrator stage 302 via low pass anti-aliasing filter 314 and continuous-time gain stage 316 (and to second integrator stage 306 via continuous-time gain stage 317 in FIGS. 3A and 3D). Low pass filter 314 reduces the aliasing effects of the high frequency distortion generated by switching stage 312 by removing the high frequency distortion from the continuous-time feedback signal. The gain level of gain stages 316 and 317 are set so that the integrator stages operate at an optimum level within their dynamic range. This continuous-time feedback signal allows the integrators to see the actual rising and falling edges of the output signal and to compensate therefor.

For applications in which the input to the amplifier is not a baseband signal, anti-aliasing filter 314 may comprise a band pass filter having cutoff frequencies appropriate to the band of the input, and integrators 302 and 306 are each replaced by a bandpass equivalent such as a resonator. According to other embodiments, integrators 302 and 306 may be configured as band pass integrators tuned to the appropriate band to achieve the same result. In other words, the principles of the embodiments described herein may be employed not only for baseband applications but for any desired frequency band. For example, the oversampled, noise-shaping, mixed-signal processor of the present invention may be employed to implement a 900 MHz power amplifier in a cellular telephone, potentially more than doubling the phone's battery life due to the increased efficiency of the amplifier.

According to various of the embodiments of FIGS. 3A–D, the output of comparator stage 310 is also selectively fed back to the integrator stages via D/A converter 318 and 319 providing state feedback in addition to the continuous-time feedback described above. In amplifier 300 of FIG. 3A, only the continuous-time feedback signal is provided to the integrators. In amplifier 340 of FIG. 3B, continuous-time feedback is provided only to integrator 302 while state feedback is provided to integrator 306. In amplifier 350 of FIG. 3C, pure state feedback is provided to integrator 306 while a combination of continuous and state feedback is provided to integrator 302 via adder 324 to compensate for loop instability introduced by the delay of low pass filter 314. Finally, in amplifier 360 of FIG. 3D, combinations of continuous and state feedback are provided to integrators 302 and 306 via adders 324 and 326, respectively. It will be understood that various combinations of continuous and state feedback may be applied to the integrator stages of different order circuits without departing from the scope of the invention.

Figure 4A:
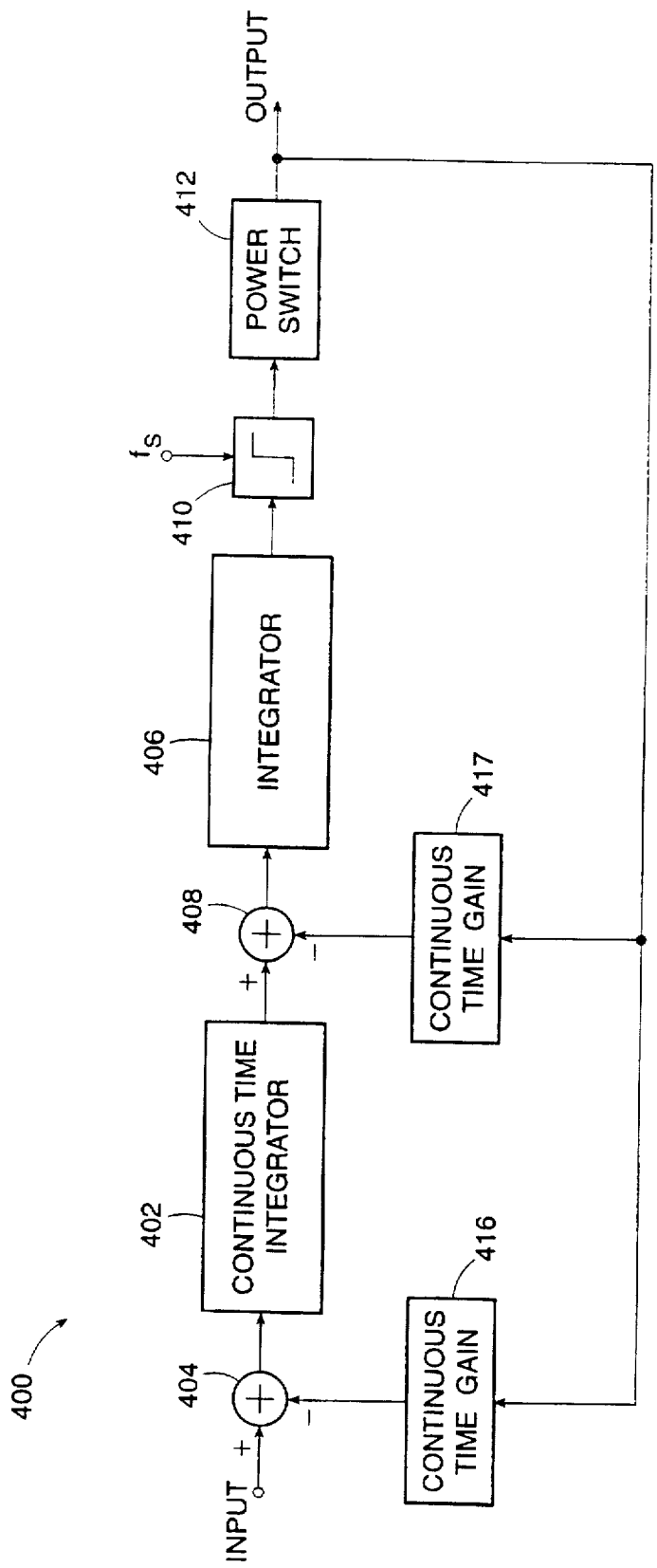
FIGS. 4A and 4B are simplified block diagrams of two specific embodiments of second-order modified oversampled, noise-shaping digital amplifier designed according to the invention.
Figure 4B:
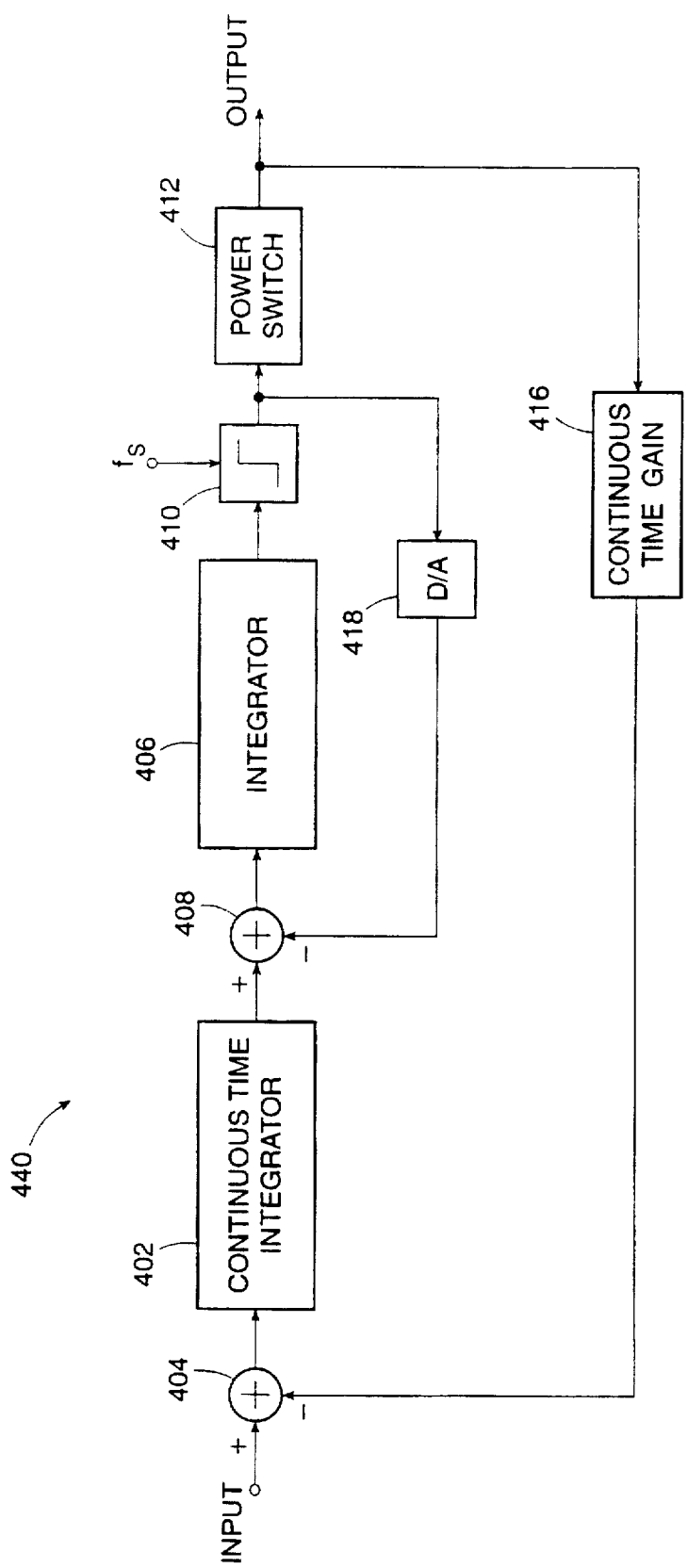

FIGS. 4A and 4B are simplified block diagrams of two embodiments 400 and 440 of a second-order modified oversampled, noise-shaping digital amplifier designed according to the invention. With reference to the common features of the two embodiments, an input signal is introduced to a first integrator stage 402 via adder 404. The output of first integrator stage 402 is transmitted to a second integrator stage 406 via adder 408. A clocked comparator stage 410 sampled at sample frequency $f_s$ receives the output of second integrator stage 406 and transmits the resulting logic signal to power switching stage 412. The continuous-time output of power switching stage is fed back to first integrator stage 402 via continuous-time gain stage 416 and adder 404. In amplifier 400 of FIG. 4A, continuous feedback is provided to second integrator stage 406 via continuous-time gain stage 417 and adder 408. Alternatively, in amplifier 440 of FIG. 4B, state feedback from the output of comparator 410 is provided to second integrator stage 406 via D/A converter 418 and adder 408.

An anti-aliasing filter is not employed in the continuous-time feedback path of amplifiers 400 and 440 to reduce high frequency aliasing because integrator stages 402 and 406 comprise continuous-time integrators which inherently accept low frequencies and reject high frequencies. This eliminates the aliasing problem mentioned above. According to other specific embodiments, because the error on the input of the first integrator stage is the dominant source of the final distortion, only the first integrator is a continuous-time integrator. Subsequent integrator stages may employ sampled integrators and may use state and/or continuous-time feedback with or without anti-aliasing filtering.

According to other specific embodiments of amplifiers 400 and 440, an anti-aliasing filter is not employed in the feedback path because integrator stages 402 and 406 comprise sampled integrators which are oversampled with respect to the comparator sample frequency $f_s$, thereby reducing high frequency aliasing.

Figure 5:
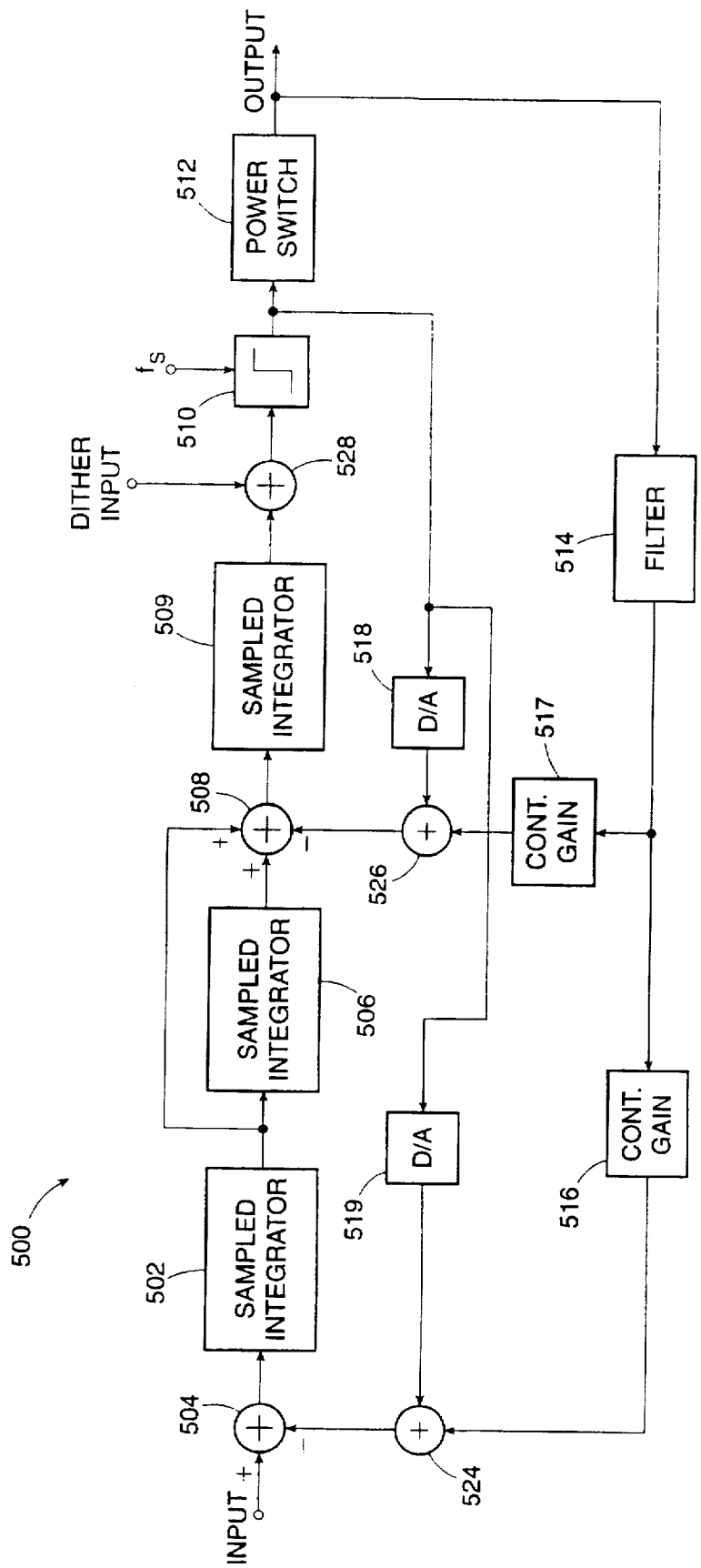
FIG. 5 is a simplified block diagram of a third-order modified oversampled, noise-shaping digital amplifier designed according to a third embodiment of the invention.

FIG. 5 is a simplified block diagram of a third-order modified oversampled, noise-shaping digital amplifier 500 designed according to a third embodiment of the invention. An input signal is introduced to a first integrator stage 502 via adder 504. The output of first integrator stage 502 is transmitted to a second integrator stage 506, from where it is then transmitted to a third integrator stage 509 via adder 508. A clocked comparator stage 510 sampled at sample frequency $f_s$ receives the output of third integrator stage 509 via adder 528 and transmits the resulting logic signal to power switching stage 512. The continuous-time output of power switching stage 512 is fed back via low pass anti-aliasing filter 514 and continuous-time gain stages 516 and 517 to first integrator stage 502 (via adders 524 and 504), and to third integrator stage 509 (via adders 526 and 508), respectively. State feedback is provided from the output of comparator 510 via D/A converter and attenuation stages 518 and 519. The state feedback is combined with the continuous-time feedback at adders 524 and 526 where it is then provided to first and third integrator stages 502 and 509, respectively. A feed forward path is provided from the output of first integrator stage 502 to adder 508 which emulates feedback from the feedback path to the input of second integrator stage 506. The feed forward path also serves to improve the dynamic range of the integrator stages. Because amplifier 500 employs sampled integrators (e.g., switched capacitor integrators), low pass filter 514 is inserted in the continuous-time feedback path to reduce aliasing effects as described above. In a more specific embodiment, a dither input is provided at the input of comparator 510 via adder 528 by which frequency-shaped, random, or pseudo-random noise may be introduced for the purpose of tone elimination.

Figure 6:
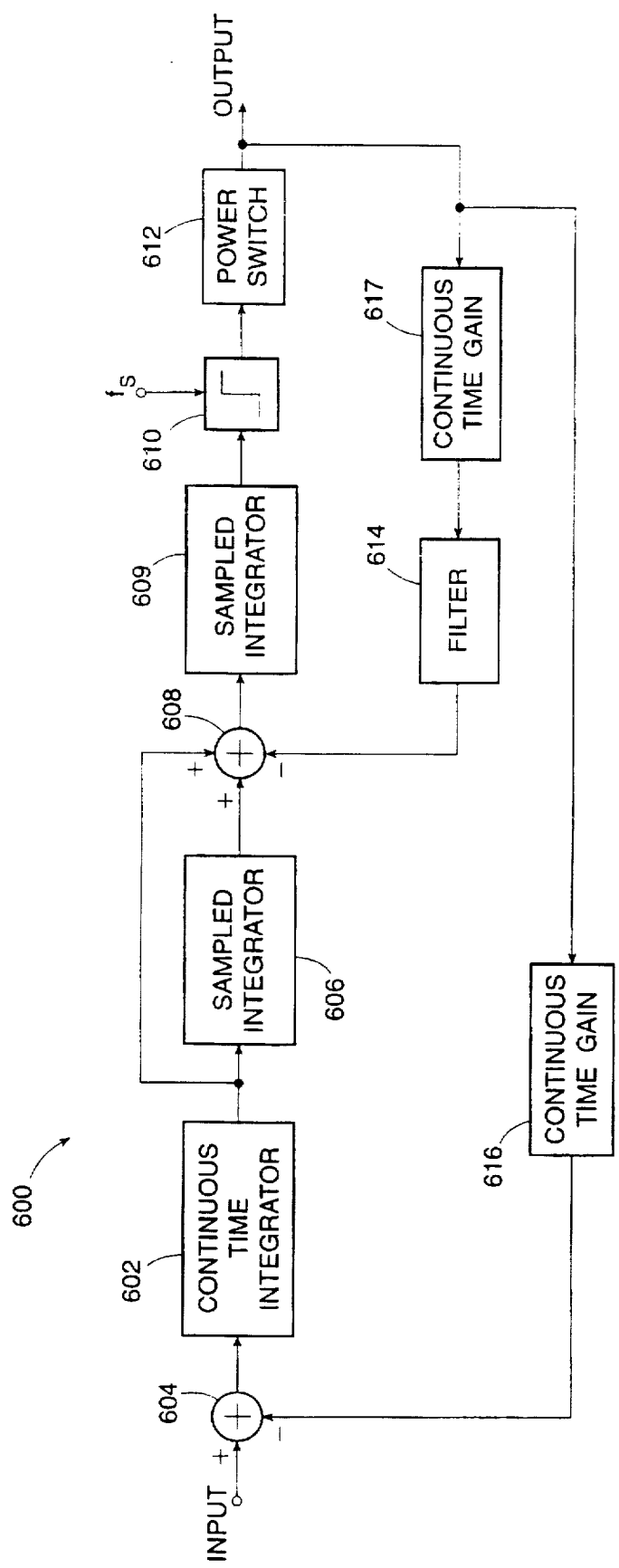
FIG. 6 is a simplified block diagram of a third-order modified oversampled, noise-shaping digital amplifier designed according to a fourth embodiment of the invention.

FIG. 6 is a simplified block diagram of a third-order modified oversampled, noise-shaping digital amplifier 600 designed according to a fourth embodiment of the invention. An input signal is introduced to a first integrator stage 602 via adder 604. The output of first integrator stage 602 is transmitted to a second integrator stage 606, from where it is then transmitted to a third integrator stage 609 via adder 608. A clocked comparator stage 610 sampled at sample frequency $f_s$ receives the output of third integrator stage 609 and transmits the resulting logic signal to power switching stage 612. The continuous-time output of power switching stage 612 is fed back to first integrator stage 602 via continuous-time gain stage 616 and adder 604. No anti-aliasing filtering is required for the feedback path to the first integrator stage because it comprises a continuous-time integrator. Continuous-time feedback is also provided to third integrator stage 609 via gain stage 617, low pass anti-aliasing filter 614 and adder 608. Low pass filter 614 is inserted in the feedback path to the third integrator stage because it comprises a sampled integrator. As with the embodiment of FIG. 5, a feed forward path is provided from the output of first integrator stage 602 to adder 608 which emulates feedback from the feedback path to the input of second integrator stage 606, and results in increased overall dynamic range.

While the invention has been particularly shown and described with reference to specific embodiments thereof, it will be understood by those skilled in the art that the foregoing and other changes in the form and details may be made therein without departing from the spirit or scope of the invention. For example, as described above, different order oversampled, noise-shaping configurations may be employed. Additionally, different combinations of continuous-time and state feedback may be employed for the different integrator stages. Different combinations of filters, gains, continuous-time integrators, and oversampled integrators may also be employed to reduce the aliasing effects of high frequency distortion in the feedback path. It is also important to note that bandpass implementations of the above-described embodiments are realizable.

It also should be noted that the present invention is not limited to the processing of analog inputs. That is, various embodiments of the present invention may be configured to process a 1-bit digital input (as described with reference to FIG. 11) with only minor adjustments to the input interface. For example, the oversampled, noise-shaping, mixed-signal processor of the present invention may be employed in digital power amplification applications to process a 1-bit digital input from a wide variety of sources.

Figure 7:
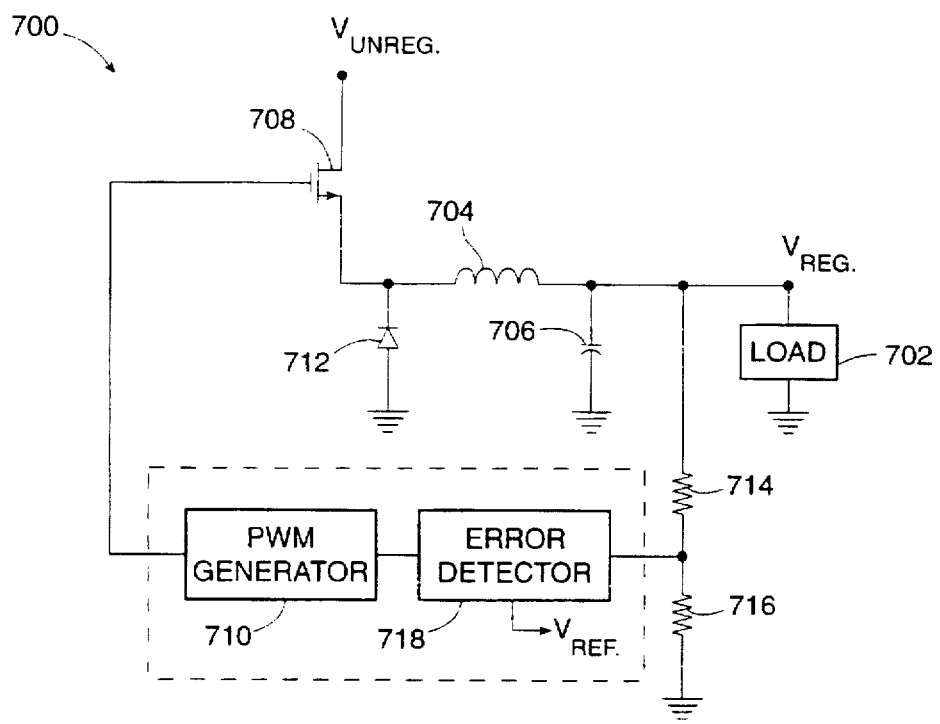
FIG. 7 is a simplified block diagram of a traditional Buck regulator designed according to the prior art.

Moreover, the field of switching power amplification is only one of the many fields in which the present invention may be employed. As described above, the invention may be employed to replace PWM technology in virtually every application in which PWM is employed, e.g., motor control applications, power factor correction, switching regulators, resonant mode switching power supplies, etc. FIG. 7 shows a simplified block diagram of a traditional Buck regulator 700 which is a well known switching regulator design used for providing regulated DC (VEG) to a load 702 from an unregulated DC source ($V_{UNREG}$). $V_{UNREG}$ is provided to a low pass LC filter comprising inductor 704 and capacitor 706 via MOSFET 708 which is switched by a PWM generator 710. In typical applications inductor 704 ranges from 50–200 μH; capacitor 706 from 100–2000 μF. The value of capacitor 706 depends upon the desired load driving capability and specific ripple requirements. A current leakage path is provided by reverse recovery diode 712, typically a Schottky diode. A resistor network comprising resistors 714 and 716 provide the regulated DC output voltage to an error detection circuit 718 which is essentially a difference amplifier which compares the regulated DC voltage to a reference voltage $V_{ref}$. The output of error detection circuit 718 drives PWM generator 710, adjusting the duty cycle in accordance with the detected deviation from $V_{ref}$. That is, if the regulated DC voltage is detected to be low, PWM generator 710 increases the duty cycle applied to the gate of MOSFET 708. Conversely, if the regulated DC voltage is detected to be high, PWM generator 710 decreases the duty cycle.

Figure 8:
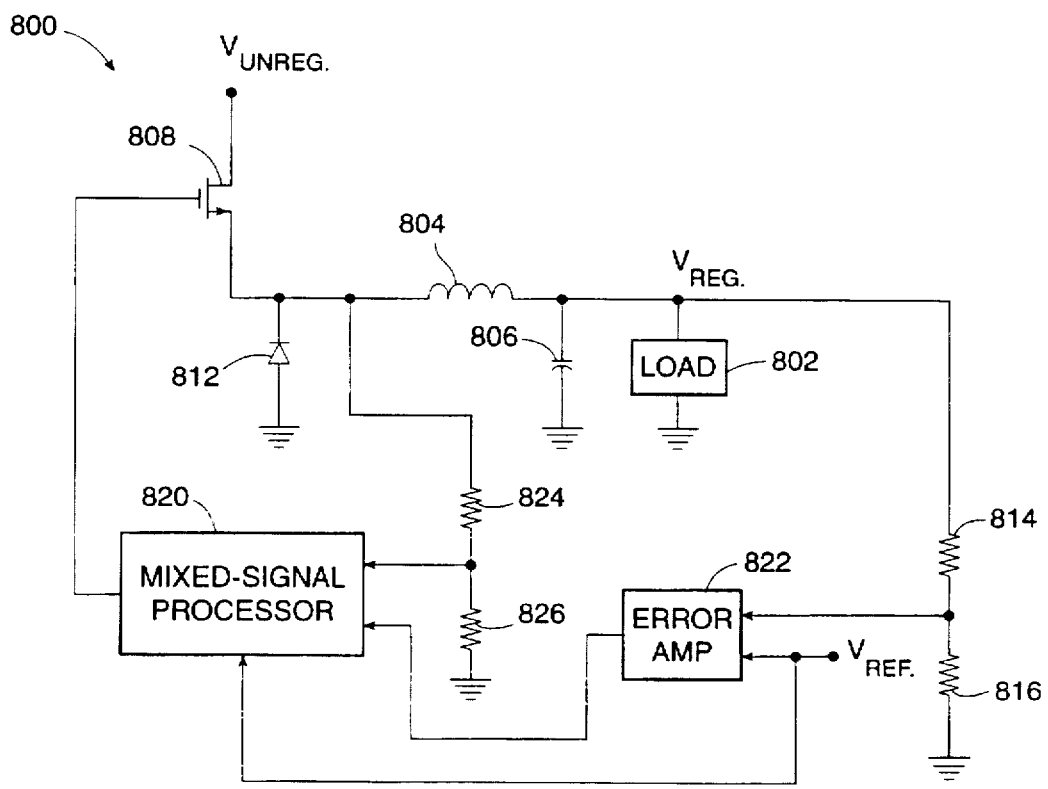
FIG. 8 is a simplified block diagram of a modified Buck regulator which employs an oversampled, noise-shaping, mixed-signal processor designed according to a specific embodiment of the present invention.

FIG. 8 shows a modified Buck regulator 800 which employs an oversampled, noise-shaping, mixed-signal processor 820 designed according to a specific embodiment of the present invention. Regulator 800 is designed similarly to regulator 700 of FIG. 7 except that PWM generator 710 and error detection circuit 718 are replaced by processor 820 and error amplifier 822, and the feedback comes from the output of MOSFET 808 via resistors 824 and 826. Processor 820 may be configured similarly to any of the embodiments described above with reference to FIGS. 3A–D, 4A, 4B, 5 and 6 or below with reference to FIG. 10. Load 802, inductor 804, capacitor 806, MOSFET 808, diode 812, and resistors 814 and 816 perform substantially the same functions as their similarly numbered counterparts in FIG. 7.

Figure 9:
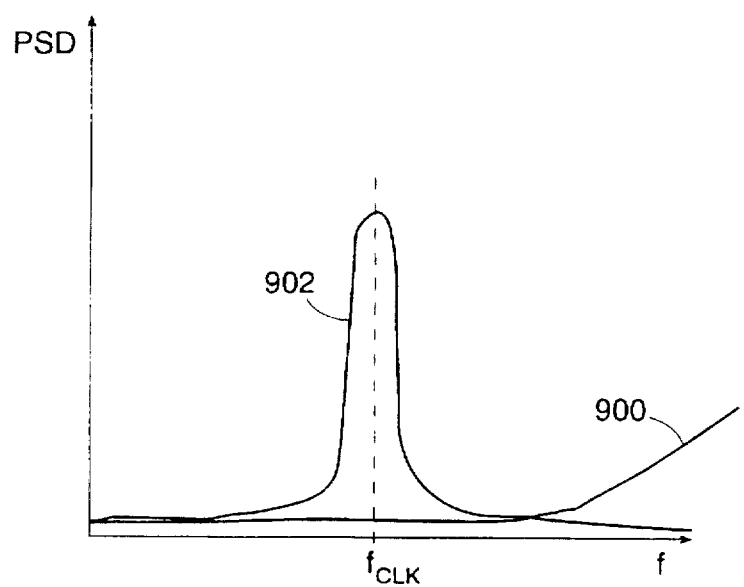
FIG. 9 is a plot of the power spectral density corresponding to an oversampled, noise-shaping, mixed-signal processor superimposed over a plot of the power spectral density corresponding to a typical PWM generator.

Several advantages may be derived from the use of the mixed-signal processor of the present invention in place of a PWM generator which may be understood with reference to FIG. 9. FIG. 9 is a plot 900 of the power spectral density corresponding to an oversampled, noise-shaping, mixed-signal processor superimposed over a plot 902 of the power spectral density corresponding to a typical PWM generator. As shown, most of the signal power for the PWM generator is in a narrow band around $f_{clk}$. By contrast, with the same power MOS technology, the processor of the present invention may be operated at sample frequencies substantially above those for similar PWM generators. This is due to the fact that sample frequencies for PWM applications are limited by the varying pulse width. That is, the sample frequency for PWM is limited because a range must be provided between the narrow and wide pulses for the modulation to occur. The switching time of the MOSFETs determines the minimum pulse width, and the clock period determines the maximum pulse width. This limitation is not a problem for the present invention which of course does not employ pulse width modulation. Thus, depending on the selection of sample frequency, the noise power for the processor designed according to the invention, while increasing with frequency, may be quite low in the region around $f_{clk}$.

If, however, more noise on the output can be tolerated, a correlative advantage of the use of the present invention in regulator 800 may be realized in that inductor 804 and capacitor 806 may be decreased in size. For example, if the application in which regulator 800 is employed can tolerate the same amount of ripple as introduced by regulator 700, the bandwidth of the LC filter of regulator 800 may be increased to encompass the same amount of noise energy as the LC filter of regulator 700, i.e., the size of either or both of inductor 804 and capacitor 806 may be reduced. Thus, increases in noise energy are counterbalanced by the advantages gained by having smaller, lighter LC components. In addition, with smaller and lighter LC components, regulator 800 can have better dynamic load regulation in that it would be able to adapt to changes in the load much more quickly than the traditional Buck regulator design shown in FIG. 7.

Another advantage of modified Buck regulator 800 over the PWM regulator of FIG. 7 relates to the number of transitions at the input to the MOSFET. For PWM applications, it is the width of the pulse which determines the regulation point. Thus, for a given sampling rate $f_{clk}$ there are $2f_{clk}$ transitions. However, for regulator 800, transitions are only made when necessary. This means that for the same sampling frequency there may be substantially fewer than $2f_{clk}$ transitions.

Figure 10:
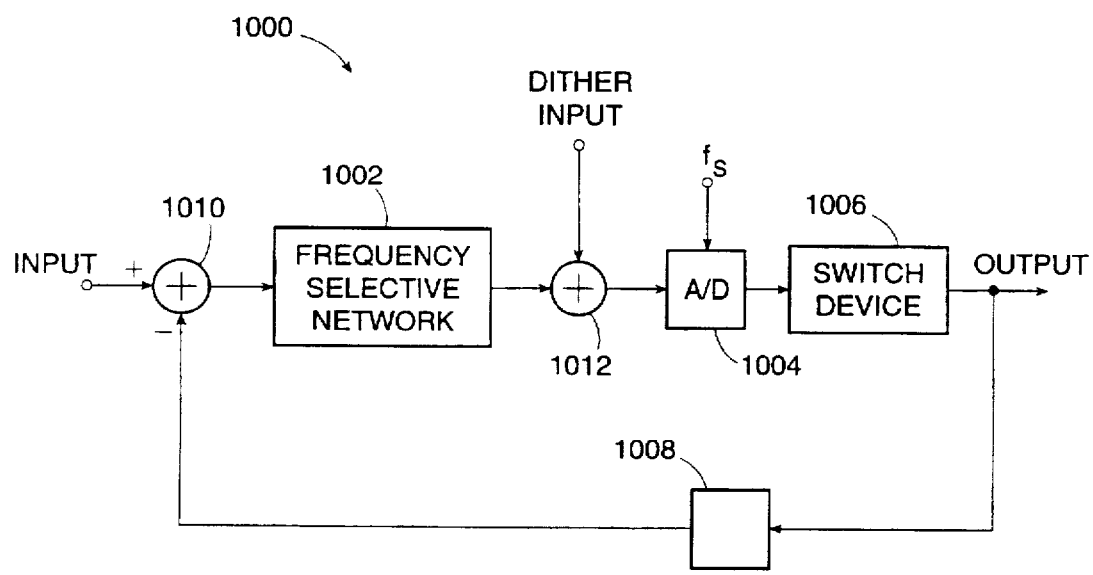
FIG. 10 is a simplified block diagram of a noise-shaping, mixed-signal processor designed according to a specific embodiment of the invention.

For implementation in a wide variety of applications, the present invention may be represented by the signal processor 1000 of FIG. 10. Frequency selective network 1002 corresponds in some embodiments to the integrators of FIGS. 3–6, but may also comprise a variety of different types of circuits including, for example, one or more resonator stages. Sampling analog-to-digital (A/D) converter 1004 receives the output from network 1002 via adder 1012 which is then sampled at $f_s$, and transmitted to switching device 1006. A/D converter 1004 and switching device 1006 generally correspond to the comparator and power switching stages, respectively, of FIGS. 3–6. It will be understood that each of these features may be implemented in a variety of ways. For example, A/D converter 1004 may be a two-level quantizer or an n-level quantizer. Moreover, switching device 1006 may comprises a single transistor or a power switching network. The continuous-time output from switching device 1006 is then fed back via feedback means 1008 to the input of network 1002 via adder 1010. As with the above-described specific embodiments, continuous-time feedback is employed to reduce or avoid various distortion effects at the output of switching device 1006. An optional dither input may be provided via adder 1012 for the introduction frequency-shaped, random, or pseudo-random noise for the purpose of tone elimination. In general, dithering technology is compatible with the present invention and may be introduced at a number of points in the oversampled, noise-shaping, mixed-signal processor as will be understood by those familiar with the technology.

Feedback means 1008 includes continuous-time gain and, according to some embodiments, either low pass or band pass filtering for reducing the aliasing effects introduced by A/D converter 1004 and switching device 1006. According to other embodiments, filtering in the feedback path is not required if the frequency selective network has anti-aliasing characteristics. This is the case for some analog frequency selective networks, or for a sampled frequency selective network which is oversampled with respect to $f_s$. If, however, the analog network does not have anti-aliasing characteristics, or if the sampled network uses the same $f_s$, filtering in the feedback path is employed for its anti-aliasing effects. It will also be understood that continuous and state feedback and various combinations thereof from the output of switching device 1006 may be introduced at intermediate points within frequency selective network 1002. Examples of such feedback are shown with respect to the second and third integrator stages of the specific embodiments described with reference to FIGS. 3–6.

It also should be noted that the present invention is not limited to the processing of analog inputs. That is, various embodiments of the present invention may be configured to process digital inputs with only minor adjustments to the input interface. For example, in the digital power amplification application shown in FIG. 11, a digital sigma-delta modulator 1100 receives a 16-bit digital input (after appropriate interpolation/upsampling in block 1101) which it converts to a single bit on the output of modulator 1100. It will be understood that modulator 1100 may be any of a variety of digital, oversampling, noise-shaping processors, and that the required interpolation/upsampling (block 1101) may be accomplished according to a variety of well known techniques. Modulator 1102 is a mixed-signal processor designed according to the invention which receives the single bit input from modulator 1100 and performs the power amplification as described above. Modulator 1102 corrects the power switching related distortion which would otherwise be introduced if the 1-bit signal were input directly to a power switching stage. If a synchronized clock is not available to mixed-signal processor 1102, a phase-locked loop may be employed to recover the clock. Alternatively, mixed-signal processor 1102 may be operated asynchronously if it has anti-aliasing characteristics such as, for example, continuous-time integrators.

Figure 11:
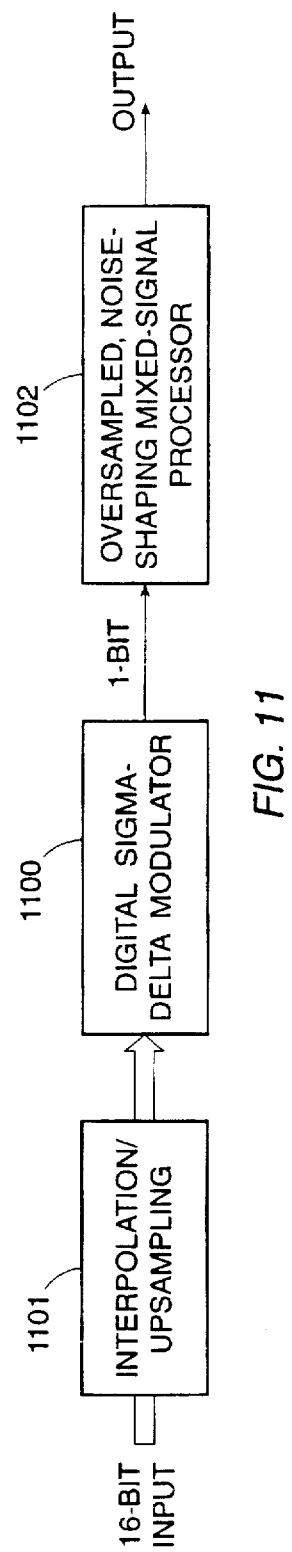
FIG. 11 is a simplified block diagram of another specific embodiment of the invention.

The principles discussed with reference to FIG. 11 may also be employed in the context of sigma-delta digital-to-analog conversion. Previous digital-to-analog solutions typically employ an integrator which receives a 1-bit input from a sigma-delta modulator or some other digital, oversampling, noise-shaping processor, and convert the 1-bit signal to an analog signal. However, due in part to the open loop nature of the integrator stage, the analog signal is susceptible to a variety of analog domain deficiencies. The mixed-signal processor of the present invention may be employed in place of the analog integrator stage to correct for these deficiencies.

Therefore, because the signal processing technique and apparatus described herein may be used in such a wide variety of applications, e.g., anywhere PWM is used, the scope of the present invention should not be limited to the embodiments described in the specification, but should be determined with reference to the appended claims.

What is claimed is:

1. An oversampled, noise-shaping, mixed-signal processor, comprising:

at least one integrator stage in a feedback loop, the at least one integrator stage having an input;

a discrete time sampling stage in the feedback loop coupled to the at least one integrator stage, the discrete time sampling stage for sampling an analog signal at a sample frequency only at discrete time intervals;

a switching stage in the feedback loop coupled to the sampling stage, the switching stage having an input and an output; and a continuous-time feedback path from the output of the switching stage to the input of the at least one integrator stage thereby closing the feedback loop, the feedback loop also including means for reducing aliasing effects corresponding to the sample frequency.

2. The oversampled, noise-shaping, mixed-signal processor of claim 1 wherein the processor comprises a plurality of integrator stages, the processor further comprising a state feedback path from the input of the switching stage to at least one of the plurality of integrator stages.

3. The oversampled, noise-shaping, mixed-signal processor of claim 2 further comprising at least one adder coupled to the continuous-time feedback path and the state feedback path for providing a combination of continuous-time feedback and state feedback to at least one of the plurality of integrator stages.

4. The oversampled, noise-shaping, mixed-signal processor of claim 1 wherein the reducing means comprise an anti-aliasing filter in the continuous-time feedback path.

5. The oversampled, noise-shaping, mixed-signal processor of claim 1 wherein the processor comprises a plurality of integrator stages, at least one of which comprises a continuous-time integrator.

6. The oversampled, noise-shaping, mixed-signal processor of claim 1 wherein the processor comprises a plurality of integrator stages, at least one of which comprises a sampled integrator.

7. The oversampled, noise-shaping, mixed-signal processor of claim 6 wherein the sampled integrator is oversampled with respect to the sample frequency.

8. The oversampled, noise-shaping, mixed-signal processor of claim 1 further comprising means for introducing a dithering signal for the purpose of tone elimination.

9. A switching power amplifier, comprising:

a first integrator stage in a feedback loop, the first integrator stage having an input;

a second integrator stage in the feedback loop coupled to the first integrator stage, the second integrator stage having an input;

a discrete time comparator stage in the feedback loop coupled to the second integrator stage;

a power switching stage in the feedback loop, the power switching stage having an input and an output, the input of the power switching stage being coupled to the comparator stage; and a continuous-time feedback path from the output of the power switching stage to the input of at least one of the first and second integrator stages thereby closing the feedback loop, the feedback loop also including means for reducing aliasing effects corresponding to a sample frequency.

10. The switching power amplifier of claim 9 further comprising a state feedback path from the input of the power switching stage to the input of at least one of the first and second integrator stages.

11. The switching power amplifier of claim 10 further comprising an adder coupled to the continuous-time feedback path, the state feedback path, and the input of at least one of the first and second integrator stages, the adder providing a combination of continuous-time and state feedback thereto.

12. The switching power amplifier of claim 9 wherein the reducing means comprise an anti-aliasing filter in the continuous-time feedback path.

13. The switching power amplifier of claim 9 wherein the power switching stage comprises a plurality of DMOS transistors.

14. The switching power amplifier of claim 13 wherein the plurality of DMOS amplifiers are arranged in an H-bridge configuration.

15. The switching power amplifier of claim 9 further comprising means for introducing a dithering signal for the purpose of tone elimination.

16. A switching power amplifier, comprising:

a first integrator stage in a feedback loop, the first integrator stage having an input;

a second integrator stage in the feedback loop coupled to the first integrator stage, the second integrator stage having an input;

a third integrator stage in the feedback loop coupled to the second integrator stage, the third integrator stage having an input;

a discrete time comparator stage in the feedback loop coupled to the third integrator stage;

a power switching stage in the feedback loop, the power switching stage having an input and an output, the input of the power switching stage being coupled to the comparator stage; and a continuous-time feedback path from the output of the power switching stage to the input of at least one of the first, second and third integrator stages thereby closing the feedback loop, the feedback loop also including means for reducing aliasing effects corresponding to a sample frequency.

17. The switching power amplifier of claim 16 further comprising:

an adder coupled to the continuous-time feedback path and to the input of at least one of the first, second and third integrator stages;

a state feedback path from the input of the power switching stage to the adder;

wherein the adder provides a combination of continuous-time and state feedback to the input of at least one of the first, second and third integrator stages.

18. The switching power amplifier of claim 16 wherein the reducing means comprises and anti-aliasing filter in the continuous-time feedback path.

19. The switching power amplifier of claim 16 wherein the power switching stage comprises a plurality of DMOS transistors.

20. The switching power amplifier of claim 19 wherein the plurality of DMOS amplifiers are arranged in an H-bridge configuration.

21. The switching power amplifier of claim 16 further comprising means for introducing a dithering signal for the purpose of tone elimination.

22. A signal processing method comprising the steps of:

introducing an input signal to a frequency selective network thereby generating a frequency-selected signal;

sampling the frequency-selected signal only at discrete time intervals at a predefined sample frequency, thereby generating a sampled signal;

switching the sampled signal thereby generating a continuous-time output signal; and feeding back the continuous-time output signal to the frequency selective network thereby generating a noise-shaped signal.

23. The method of claim 22 wherein the introducing step is performed by at least one integrator stage, the method further comprising the step of feeding back the sampled signal to the at least one integrator stage.

24. The method of claim 23 further comprising the steps of:

combining the continuous-time output signal and the sampled signal thereby generating a combined feedback signal; and feeding back the combined feedback signal to the at least one integrator stage.

25. The method of claim 22 further comprising the step of reducing aliasing effects.

26. The method of claim 25 wherein the reducing step comprises filtering the continuous-time output signal with an anti-aliasing filter before the feeding it back to the frequency selective network.

27. The method of claim 25 wherein the frequency selective network comprises at least one sampled stage, the reducing step comprising oversampling the at least one sampled stage with respect to the sample frequency.

28. The method of claim 25 wherein the frequency selective network comprises at least one integrator stage, the reducing step comprising providing the at least one integrator stage with anti-aliasing characteristics.

29. The method of claim 22 further comprising the step of introducing a dithering signal to the frequency-selected signal for the purpose of tone elimination.

30. The method of claim 22 wherein the input signal comprises an analog signal.

31. The method of claim 22 wherein the input signal comprises a digital signal.

32. A signal processing circuit, comprising:

a frequency selective network in a feedback loop;

a sampling analog-to-digital converter in the feedback loop, the sampling analog-to-digital converter being sampled at a sample frequency;

a switching device coupled to be driven by the sampling analog-to-digital converter to produce a continuous-time output signal; and means for continuously sensing and feeding back the continuous-time output signal to the frequency selective network for noise and distortion correction in the feedback loop and noise shaping.

33. The signal processing circuit of claim 32 wherein the frequency selective network is an analog frequency selective network having anti-aliasing characteristics.

34. The signal processing circuit of claim 32 wherein the frequency selective network is an analog frequency selective network, and wherein the sensing and feeding back means comprises an anti-aliasing filter.

35. The signal processing circuit of claim 32 wherein the frequency selective network is a sampled frequency selective network.

36. The signal processing circuit of claim 35 wherein the sampled frequency selective network is oversampled with respect to the sample frequency.

37. The signal processing circuit of claim 35 wherein the sensing and feeding back means comprises an anti-aliasing filter.

38. The signal processing circuit of claim 32 wherein the frequency selective network comprises at least one integrator stage.

39. The signal processing circuit of claim 32 wherein the frequency selective network comprises at least one resonator stage.

40. The signal processing circuit of claim 32 wherein the sampling analog-to-digital converter comprises a two-level quantizer.

41. The signal processing circuit of claim 32 wherein the sampling analog-to-digital converter comprises an n-level quantizer.

42. The signal processing circuit of claim 32 wherein the frequency selective network is configured to receive an analog input signal.

43. The signal processing circuit of claim 32 wherein the frequency selective network is configured to receive a digital input signal.

44. An oversampled, noise-shaping, mixed-signal processor, comprising:
   at least one integrator stage in a feedback loop, the at least one integrator stage having an input;
   a sampling stage in the feedback loop coupled to the at least one integrator stage, the sampling stage for sampling an analog signal at a sample frequency;
   a switching stage in the feedback loop coupled to the sampling stage, the switching stage having an input and an output; and
   a continuous-time feedback path from the output of the switching stage to the input of the at least one integrator stage thereby closing the feedback loop, the feedback loop also including means for reducing aliasing effects corresponding to the sample frequency, wherein the processor comprises a plurality of integrator stages, the processor further comprising a state feedback path from the input of the switching stage to at least one of the plurality of integrator stages.

45. The oversampled, noise-shaping, mixed-signal processor of claim 44 further comprising at least one adder coupled to the continuous-time feedback path and the state feedback path for providing a combination of continuous-time feedback and state feedback to at least one of the plurality of integrator stages.

46. The oversampled, noise-shaping, mixed-signal processor of claim 44 wherein the processor comprises a plurality of integrator stages, at least one of which comprises a sampled integrator.

47. The oversampled, noise-shaping, mixed-signal processor of claim 46 wherein the sampled integrator is oversampled with respect to the sample frequency.

48. The oversampled, noise-shaping, mixed-signal processor of claim 44 further comprising means for introducing a dithering signal for the purpose of tone elimination.

49. A signal processing method comprising the steps of:
   introducing an input signal to a frequency selective network thereby generating a frequency-selected signal;
   sampling the frequency-selected signal at intervals at a sample frequency, thereby generating a sampled signal;
   switching the sampled signal thereby generating a continuous-time output signal; and
   feeding back the continuous-time output signal to the frequency selective network while reducing aliasing effects thereby generating a noise-shaped signal, wherein the frequency selective network comprises at least one sampled stage, the reducing step comprising oversampling the at least one sampled stage with respect to the sample frequency.

50. A signal processing method comprising the steps of:
   introducing an input signal to a frequency selective network thereby generating a frequency-selected signal;
   sampling the frequency-selected signal at intervals at a sample frequency, thereby generating a sampled signal;
   switching the sampled signal thereby generating a continuous-time output signal;
   feeding back the continuous-time output signal to the frequency selective network thereby generating a noise-shaped signal; and
   introducing a dithering signal to the frequency-selected signal for the purpose of tone elimination.

* * * * *